United States Patent
Yoon

(10) Patent No.: US 6,815,334 B2
(45) Date of Patent: Nov. 9, 2004

(54) METHOD FOR FORMING MULTI-LAYER METAL LINE OF SEMICONDUCTOR DEVICE

(75) Inventor: Jun Ho Yoon, Chungcheongbuki-do (KR)

(73) Assignee: Hynix Semiconductor, Inc., Kyoungki-do (KR)

( * ) Notice: Subject to any disclaimer, the term of this patent is extended or adjusted under 35 U.S.C. 154(b) by 0 days.

(21) Appl. No.: 10/330,057

(22) Filed: Dec. 30, 2002

(65) Prior Publication Data

US 2003/0129825 A1 Jul. 10, 2003

(30) Foreign Application Priority Data

Jan. 9, 2002 (KR) .......................................... 2002-1202

(51) Int. Cl.[7] .......................................... H01L 21/4763
(52) U.S. Cl. ...................... 438/624; 623/697; 623/634
(58) Field of Search ................................ 438/623, 624, 438/626, 631, 663, 634, 694, 697

(56) References Cited

U.S. PATENT DOCUMENTS

| | | | |
|---|---|---|---|
| 6,027,995 A | * | 2/2000 | Chiang et al. .............. 438/623 |
| 6,187,672 B1 | * | 2/2001 | Zhao et al. ................. 438/639 |
| 6,211,063 B1 | * | 4/2001 | Liu et al. ................... 438/624 |
| 6,514,852 B2 | * | 2/2003 | Usami ........................ 438/624 |
| 6,667,553 B2 | * | 12/2003 | Cerny et al. ................ 257/758 |

OTHER PUBLICATIONS

Wolf et al., "Silicon Processing for the VLSI Era: vol. I", pp. 547–549, 1986.*
Coenegrachts, J., *Integration of Unlanded via in a Nonetchback SOG Direct–on–Metal Approach in 0.25 Micron CMOS Process*, Interconnect Technology Conference, 1998, Proceedings of the IEEE 1998 International, Jun. 1–3 1998, pp. 45–47.
Wilson, S.R., *Handbook of Multilevel Metallization for Integrated Circuits* (Materials, Technology, and Applications), Noyws Publications, 1993, pp. 392–396.
Wolf, S., *Silcon Processing for the VLSI Era*, vol. I, Process Technology, 2$^{nd}$ Ed., Lattice Press, 2000, pp. 475–479.

* cited by examiner

Primary Examiner—Amir Zarabian
Assistant Examiner—Christy Novacek
(74) Attorney, Agent, or Firm—Jacobson Holman PLLC

(57) ABSTRACT

A method for forming a multi-layer metal line of a semiconductor device, including the steps of forming a first insulating film on a semiconductor substrate having a lower metal line thereon, planarizing the first insulating film until a predetermined thickness remains, removing the remaining portion of the first insulating film on the lower metal line, and forming an etch barrier layer on the entire surface. A second insulating film is formed with an oxide film thereon, and the oxide film, the second insulating film and the etch barrier layer are selectively etched to form a via contact hole exposing the lower metal line. The etching of the second insulating film is performed under specifies conditions so that a protective film is formed on a sidewall of the via contact hole.

11 Claims, 6 Drawing Sheets

METHOD FOR FORMING MULTI-LAYER METAL LINE OF SEMICONDUCTOR DEVICE

BACKGROUND OF THE INVENTION

1. Field of the Invention

The present invention relates to a method for forming a multi-layer metal line of a semiconductor device, and in particular to an improved method for forming a multi-layer metal line of a semiconductor device wherein a insulating film having a low dielectric constant is used in a formation process of an interlayer insulating film of the multi-layer metal line to improve characteristics and reliability of the device.

2. Description of the Background Art

In general, a line of a semiconductor device for electrically connecting devices or device to an external circuit is formed by filling a contact hole and a via hole for interconnection with a line material to form a line layer, and performing subsequent processes. In particular, a metal line is used in a region where a low resistance is required.

The metal line is formed by filling the contact hole and the via hole with the line material, such as an aluminum alloy containing aluminum and a small amount of silicon and/or copper which has a low resistance and excellent processing characteristics according to sputtering of physical vapor deposition (PVD).

Due to a high integration tendency of the semiconductor device, in a process formation of a metal line, a low-K material layer having a low dielectric constant is formed as an interlayer insulating material to reduce resistance capacitance delay by spin coating, and a via hole for connecting an upper line to a lower line is formed, and filled the via hole to form a tungsten contact plug.

Here, since the insulating film is non-uniformly coated on the metal line by the spin-coating process, the thickness of the insulating film depends on a width and density of the metal line therebelow.

An inter-capacitance value between the upper metal line and the lower metal line varies due to non-uniform thickness according to the width and density of the metal line, which deteriorates characteristics of the device.

Moreover, bowing phenomenon occurs during a dry etching process of the via hole, which complicates etching conditions, and the bowing on the sidewalls of the via hole makes deposition of an adhesive film and a diffusion barrier film difficult, which complicates a subsequent process, namely a formation process of a tungsten contact plug.

Furthermore, the end of the metal line is shorted and rounded due to a proximate effect during the patterning process of the metal line, which reduces process margin in a via contact etching process. As a result, the characteristics of the device are deteriorated.

FIGS. 1a to 1e are cross-sectional views illustrating a conventional method for forming a multi-layer metal line of a semiconductor device.

Referring to FIG. 1a, a lower metal line 13 is formed on a semiconductor substrate 11. Here, the lower metal line 13 is composed of an aluminum alloy, and has Ti or Ti/TiN stacked layer at the upper and lower portions of the lower metal line 13.

Reference numeral 100 denotes a region where the area of the lower metal line varies, and reference numeral 200 denotes a region where the density of the lower metal line varies. That is, a metal line having a large area is formed at the left side of region 100, and a metal line having a small area is formed at the right side thereof. A density of the metal line at the left side of the region 200 is relatively higher than that of the right side thereof.

Thereafter, an insulating film 15 having a low dielectric constant is formed on the entire surface. Here, the insulating film 15 is formed according to spin coating using a material having a dielectric constant of about 3.

Although the insulating film 15 has an excellent filling property between metals, namely high step coverage, it is not uniformly coated on the metal line due to its adhesiveness, but unevenly coated on the metal line depending on a width and density of the metal line.

In general, the insulating film 15 is coated thicker on the metal line having the larger area than on the metal line having the smaller area, and in the region having high metal line density than the region having low metal line density.

Thereafter, an oxide film 17 is deposited on the insulating film 15 according to plasma enhanced chemical vapor deposition (PECVD).

Here, the oxide film 17 is formed using a material having a dielectric constant of about 4 at a thickness ranging from 5000 to 12000 Å.

A chemical mechanical polishing (CMP) is performed on the oxide film 17 to form an interlayer insulating film having a stacked structure of the insulating film 15 and the oxide film 17.

As shown in FIG. 1b, a photosensitive film pattern 19 is formed on the interlayer insulating films 15 and 17.

Here, the photosensitive film pattern 19 is formed according to exposure and development processes using a via contact mask (not shown).

As illustrated in FIG. 1c, a via contact hole 21 exposing the lower metal line 13 is formed by etching the interlayer insulating films 17 and 15 using the photosensitive film pattern 19 as a mask.

Since an etch selectivityivity ratio of the insulating film 15 is at least 1.5 times higher than the etching selectivity ratio of the oxide film 17, a portion of the insulating film 15 which is thicker is laterally etched, thereby generating bowing.

In addition, a portion of the insulating film 15 at the side portions of the lower metal line 13 is etched due to a small process margin of the via contact etching process, and thus metallic polymers remain therein.

Referring to FIG. 1d, the residual photosensitive film pattern 19 is removed after the etching process, and a Ti/TiN film 23 which is an adhesive layer/diffusion barrier film is formed on the entire surface of the resulting structure including a sidewall and bottom of the via contact hole 21. Here, the Ti/TiN film 23 is thinly formed or rarely formed in a portion where bowing phenomenon occurs or metallic polymers remain.

As depicted in FIG. 1e, a tungsten layer 25 filling the via contact hole 21 is formed on the entire surface of the resulting structure.

The tungsten layer 25 is not deposited on a portion where the Ti/TiN film 23 is not deposited, thereby deteriorating the property of the device.

As described above, in the conventional method for forming the multi-layer metal line of the semiconductor device, a bowing phenomenon occurs in the subsequent process because the insulating film having the high etch selectivityivity ratio is laterally etched during the via contact etching process. Over-etching of the insulating film in the subsequent via contact process generates the metallic polymers because the process margin is reduced due to shorting or rounding in the metal line patterning process, thereby deteriorating the property and reliability of the device.

SUMMARY OF THE INVENTION

Accordingly, it is an object of the present invention to provide a method for forming a multi-layer metal line of a semiconductor device wherein high integration of the semiconductor device is achieved by forming a via contact plug without generating bowing or metallic polymers due to over-etching.

In order to achieve the above-described object of the invention, there is provided a method for forming a multi-layer metal line of a semiconductor device, including the steps of: forming a first insulating film having a low dielectric constant on a semiconductor substrate having a lower metal line thereon; planarizing the first insulating film until a predetermined thickness of the first insulating film remains on the lower metal line; removing the first insulating film on the lower metal line by plasma etching to expose a entire portion of the lower metal line; forming an etch barrier layer on the entire surface; forming a second insulating film having a low dielectric constant on the etch barrier layer; forming an oxide film on the second insulating film; etching the oxide film, the second insulating film and the etch barrier layer according to a photoetching process using a via contact mask to form a via contact hole exposing the lower metal line; forming an adhesive film/diffusion barrier film on the entire surface of the resulting structure including a sidewall of the via contact hole and the exposed portion of the lower metal line; and forming a contact plug filling the via contact hole, and forming an upper metal line contacting the contact plug.

On the other hand, the principle of the present invention will now be explained.

A first insulating film having a low dielectric constant (dielectric constant≈~3) is coated on a lower metal line, and then planarized to expose the lower metal line. An etch barrier layer (dielectric constant≈~4.5) is formed thereon, a planarized second insulating film having a low dielectric constant (dielectric constant≈~3) is formed thereon, and an oxide film (dielectric constant≈~4) is formed thereon, thereby forming an interlayer insulating film having a stacked structure of the first insulating film, the etch barrier layer, the second insulating film and the oxide film. Here, the first and second insulating films having low dielectric constants are formed thicker in the interlayer insulating film, and the etch barrier layer is formed with SiC having a low dielectric constant, thereby offsetting or decreasing an inter-capacitance.

In addition, each layer in the interlayer insulating film is etched under different conditions during a via contact etching process, thereby preventing generation of metallic polymers due to over-etching resulting from misalignment. Therefore, the property of the device is not degraded.

BRIEF DESCRIPTION OF THE DRAWINGS

The present invention will become better understood with reference to the accompanying drawings which are given only by way of illustration and thus are not limitative of the present invention, wherein.

DETAILED DESCRIPTION OF THE PREFERRED EMBODIMENTS

A method for forming a multi-layer metal line of a semiconductor device in accordance with a preferred embodiment of the present invention will now be described in detail with reference to the accompanying drawings.

FIGS. 2a to 2f are cross-sectional views illustrating sequential steps of the method for forming the multi-layer metal line of the semiconductor device in accordance with the preferred embodiment of the present invention.

Figure 1A:
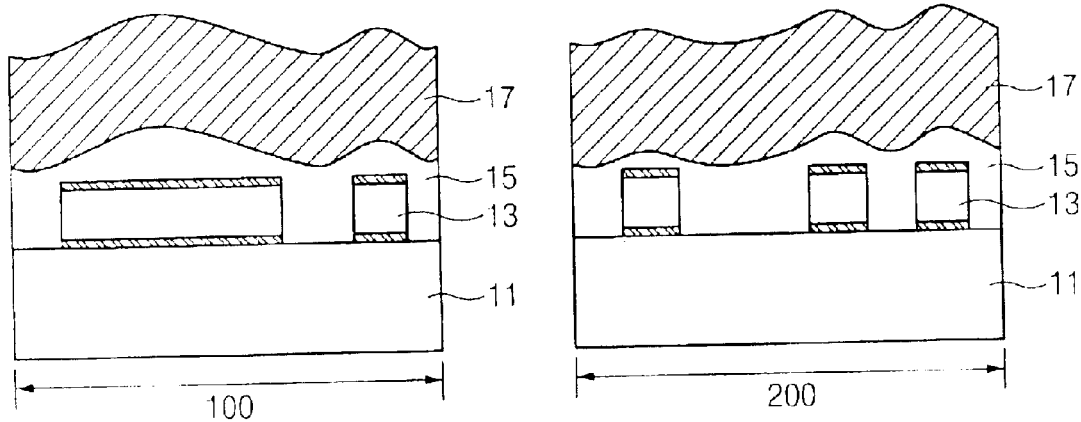
FIGS. 1a to 1e are cross-sectional views illustrating sequential steps of a conventional method for forming a multi-layer metal line of a semiconductor device.
Figure 1B:
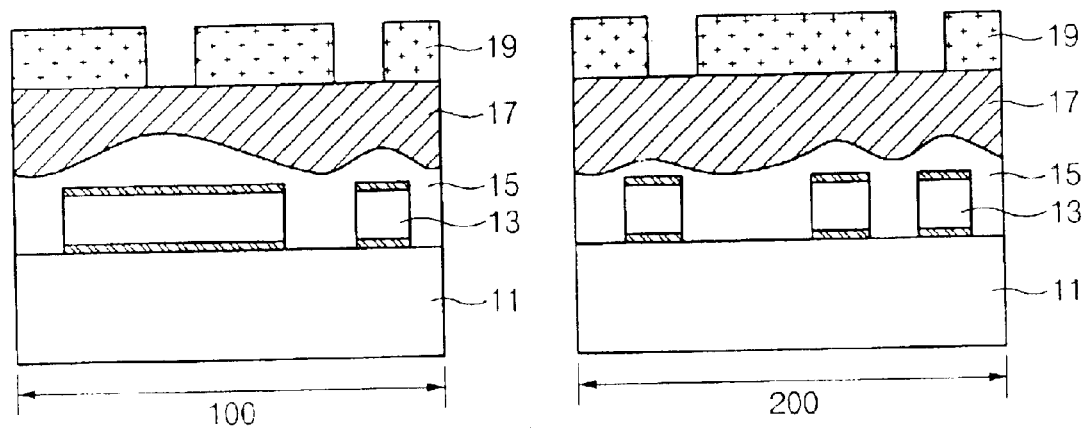
Figure 1C:
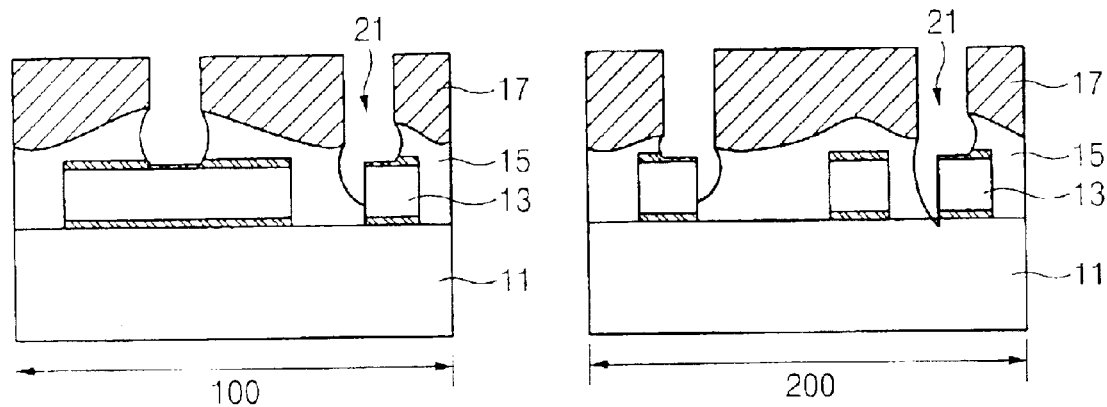
Figure 1D:
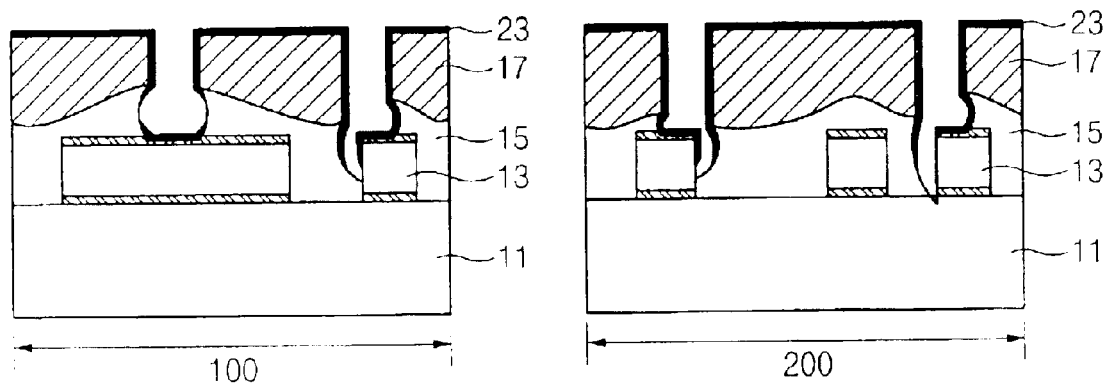
Figure 1E:
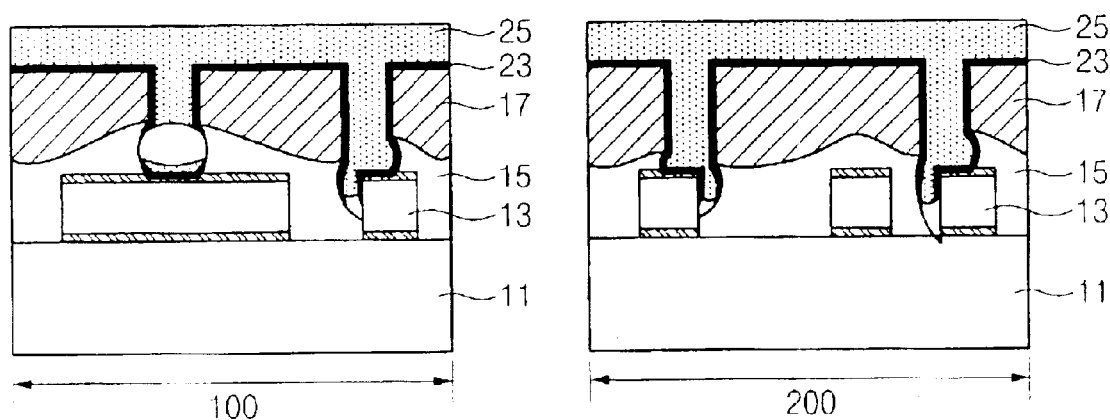
Figure 2A:
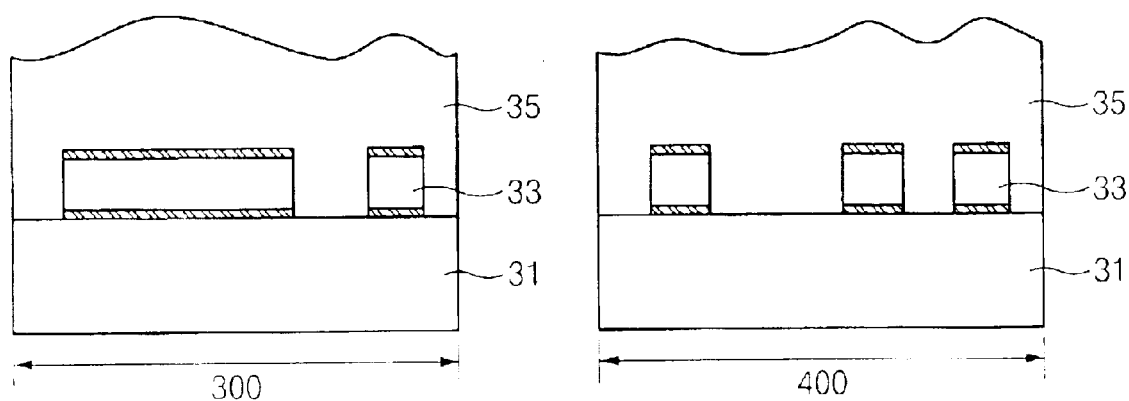
FIGS. 2a to 2f are cross-sectional views illustrating sequential steps of a method for forming a multi-layer metal line of a semiconductor device in accordance with a preferred embodiment of the present invention.

Referring to FIG. 2a, a lower metal line 33 is formed on a semiconductor substrate 31. Here, the lower metal line 33 is composed of an aluminum alloy, and has Ti or Ti/TiN stacked layer at the upper and lower portions of the lower metal line 33.

Reference numeral 300 denotes a region where the area of the lower metal line varies, and reference numeral 400 denotes a region where the density of the lower metal linevaries. That is, a metal line having a large area is formed at the left side of region 300, and a metal line having a small area is formed at the right side thereof. A density of the metal line at the left side of the region 400 is relatively higher than that of the right side thereof.

Thereafter, a first insulating film 35 having a low dielectric constant is formed on the entire surface. Here, the first insulating film 35 is formed by spin coating using a material having a dielectric constant of about 3 to have a thickness ranging from 6000 to 8000 Å.

Although the first insulating film 35 has an excellent filling property between metals, namely high step coverage, it is not uniformly coated on the metal line due to its adhesiveness, but unevenly coated on the metal line depending on a width and density of the metal line.

In general, the first insulating film 35 is coated thicker on the metal line having large area than on the metal line having small area, and in the region having high metal line density than the region having low metal line density.

Figure 2B:
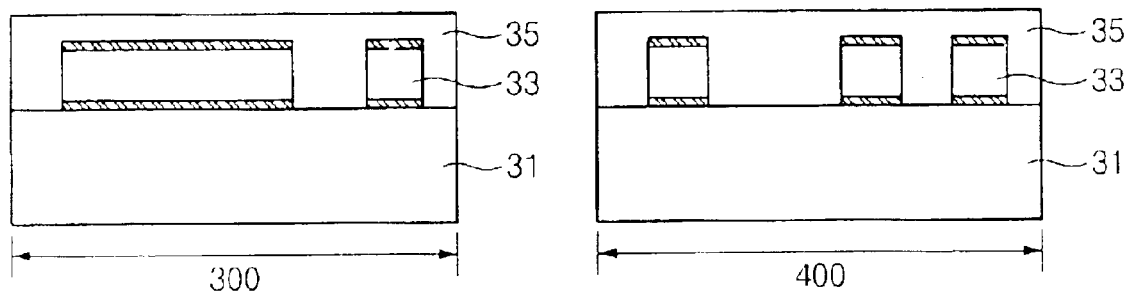

Referring to FIG. 2b, the first insulating film 35 is planarized via chemical mechanical polishing (CMP) so that 1000 to 2000 Å of the first insulating film 35 remains on the lower metal line 33.

Figure 2C:
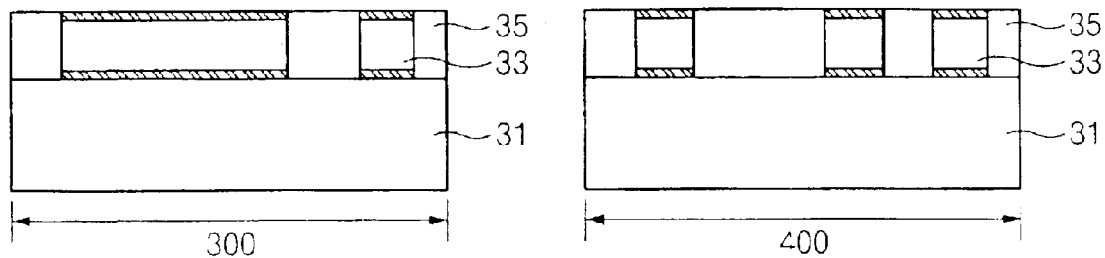

Referring to FIG. 2c, a plasma etching process is performed to expose the lower metal line 33.

Here, the plasma etching process is performed in an equipment having a low ion density of $1 \times 10^{10}$ ion/cm$^3$ under a pressure ranging from 1000 to 1500 mTorr of, with a power ranging from 500 to 800 watt, $CHF_3$ having a flow rate ranging from 50 to 70 sccm, $CF_3$ having a flow rate ranging from 100 to 150 sccm and Ar having a flow rate ranging from 1000 to 1500 sccm.

When the first insulating film 35 is removed, the first insulating film 35 between the lower metal lines 33 should not be over-etched by controlling an etching time or through end point detection.

Thereafter, polymers generated during the plasma etching process are removed according to a cleaning process.

Figure 2D:
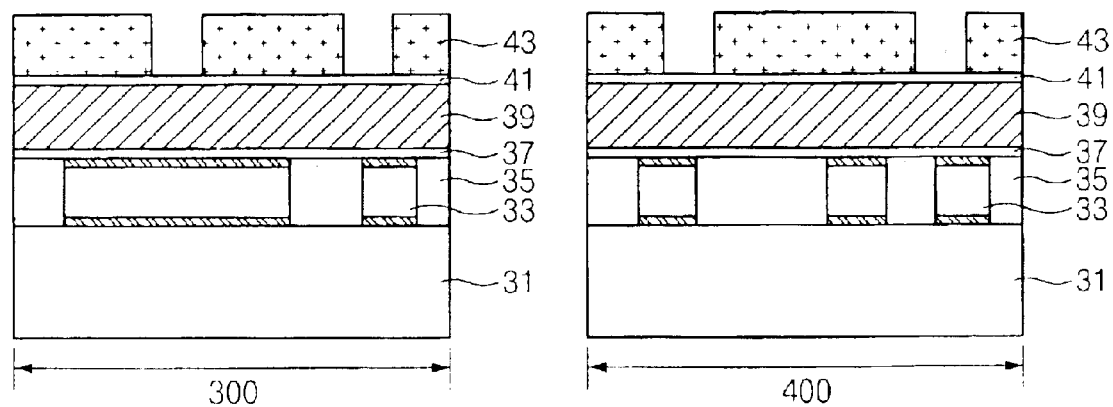

Referring to FIG. 2d, an etch barrier layer 37 is formed on the entire surface of the resulting structure according to plasma enhanced chemical vapor deposition (PECVD).

Here, the etch barrier layer 37 is preferably composed of SiC having a dielectric constant of about 4.5 and a thickness ranging from 500 to 1000 Å.

A second insulating film 39 having a low dielectric constant is formed on the etch barrier layer 37 according to a spin coating process. A thickness of the second insulating film 39 is adjusted according to process capability and performance of the device.

An oxide film 41 for prevention of exposure of the second insulating film 39 to atmosphere is formed according to the PECVD.

Here, the oxide film 41 is composed of an oxide having a dielectric constant of about 4 and a thickness ranging from 500 to 1000 Å.

A photosensitive film pattern 43 is formed on the oxide film 41. The photosensitive film pattern 43 is formed according to exposure and development processes using a via contact mask (not shown).

Figure 2E:
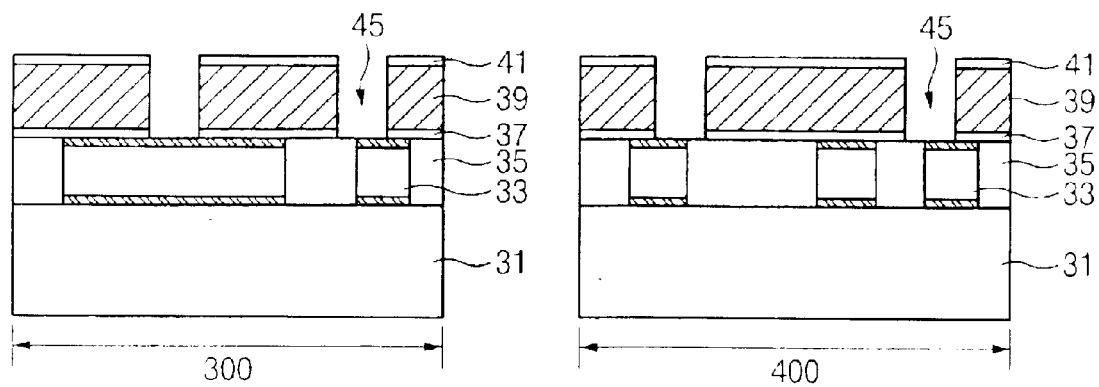

Referring to FIG. 2e, a via contact hole 45 exposing the lower metal line 33 is formed by etching the oxide film 41, the second insulating film 39 and the etch barrier layer 37 using the photosensitive film pattern 43 as a mask. Here, the etching conditions of each layer should be adjusted to prevent over-etching.

Here, the process for etching the oxide film 41 is performed in an equipment having an ion density of $1 \times 10^{10}$ ion/cm$^3$ under a pressure ranging from 30 to 50 mTorr, with a power ranging from 1300 to 1700 watt, $CF_4$ having a flow rate ranging from 80 to 120 sccm, Ar having a flow rate ranging from 200 to 300 sccm and $O_2$ having a flow rate ranging from 15 to 25 sccm.

The process for etching the second insulating film 39 is performed under the conditions that a protective film is formed on the sidewalls of the via contact hole and etching is sentireped at the SiC film which is the etch barrier layer. Specifically, the process for etching the second insulating film includes using a fluorocarbon gas having a high C/F ratio such as $C_4F_8$ to generate a large amount of polymers, removing free fluorine by controlling CO gas instead of $O_2$ gas to improve an etch selectivity ratio of the insulating film to the SiC film, using $N_2$ gas to maintain the protective film on the sidewalls of the via contact hole so that the generation of polymers is accelerated and increasing an etch selectivity difference between the insulating film and the etch barrier layer to be over 5 to generate an etch sentire. Here, the process for etching the second insulating film is performed under a pressure ranging from 30 to 50 mTorr of with a power ranging from 1300 to 1600 watt, $C_4F_8$ having a flow rate ranging from 10 to 20 sccm, CO having a flow rate ranging from 150 to 250 sccm and $N_2$ having a flow rate ranging from 100 to 150 sccm.

The process for etching the etch barrier layer 37 is performed by using a fluorocarbon gas having a high C/F ratio such as $C_4F_8$ and controlling $O_2$ gas to prevent damage to the sidewalls of the via contact hole of the insulating film. Here, the process for etching the etch barrier layer 37 is performed under a pressure ranging from 40 to 60 mTorr, with a power ranging from 200 to 300 watt, $C_4F_8$ having a flow rate ranging from 10 to 20 sccm, $O_2$ having a flow rate ranging from 15 to 25 sccm, and Ar having a flow rate ranging from 100 to 150 sccm.

Thereafter, the residual photosensitive film pattern 43 on the oxide film 41 is removed.

Figure 2F:
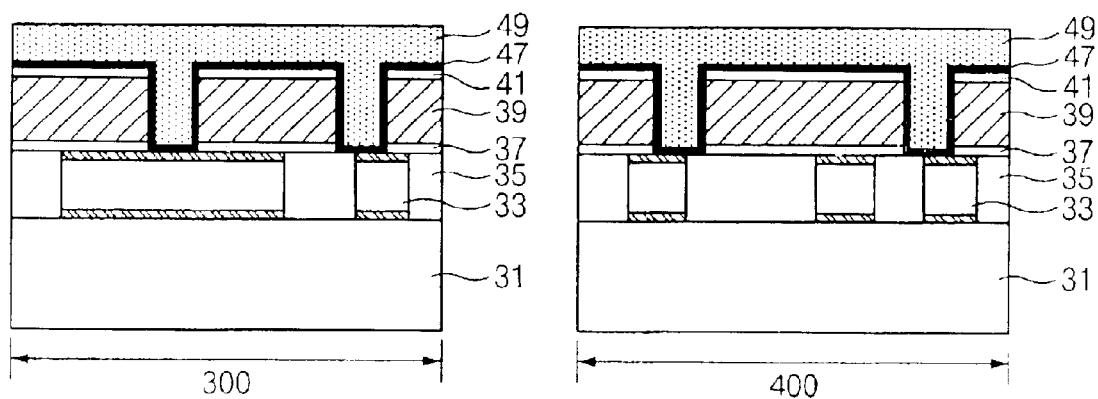

As shown in FIG. 2f, a Ti/TiN film 47 which is an adhesive film/diffusion barrier film is formed on the entire surface of the resulting structure including a sidewall and bottom portion of the via contact hole 45.

Here, the Ti/TiN film 47 is formed according to the PECVD.

A tungsten layer 49 filling the via contact hole 45 is formed on the entire surface of the resulting structure.

A contact plug (not shown) is formed by planarizing the tungsten layer 49, and an upper metal line (not shown) is formed to contact the contact plug.

As discussed earlier, in accordance with the present invention, the method for forming the multi-layer metal line of the semiconductor device provides improved characteristics of the device by maintaining the inter-capacitance constant regardless of the metal line, improved resistance capacitance delay by decreasing the inter-capacitance resulting from the use of the insulating film, and prevention of the bowing phenomenon and metallic polymers to facilitate the subsequent processes. As a result, the characteristics and reliability of the semiconductor device are improved, and the high integration thereof can be achieved.

As the present invention may be embodied in several forms without departing from the spirit or essential characteristics thereof, it should also be understood that the above-described embodiment is not limited by any of the details of the foregoing description, unless otherwise specified, but rather should be construed broadly within its spirit and scope as defined in the appended claims, and therefore all changes and modifications that fall within the metes and bounds of the claims, or equivalences of such metes and bounds are therefore intended to be embraced by the appended claims.

What is claimed is:

1. A method for forming a multi-layer metal line of a semiconductor device, comprising the steps of:

forming a first insulating film having a low dielectric constant on a semiconductor substrate having a lower metal line thereon;

planarizing the first insulating film until a predetermined thickness of the first insulating film remains on the lower metal line;

removing the remaining portion of the first insulating film on the lower metal line by plasma etching to expose the lower metal line;

forming an etch barrier layer on the entire surface;

forming a second insulating film having a low dielectric constant on the etch barrier layer;

forming an oxide film on the second insulating film;

selectively etching the oxide film, the second insulating film and the etch barrier layer to form a via contact hole exposing the lower metal line, wherein the step of etching the second insulating film is performed under the condition of a pressure ranging from 30 to 50 mTorr, power ranging from 1300 to 1600 watt, $C_4F_8$, having a flow rate ranging from 10 to 20 sccm, CO having a flow rate ranging from 150 to 250 sccm and $N_2$ having a flow rate ranging from 100 to 150 sccm so that a protective film is formed on a sidewall of the via contact hole;

forming an adhesive film/diffusion barrier film on the entire surface of the resulting structure; and forming a contact plug filling the via contact hole, and forming an upper metal line contacting the contact plug.

2. The method according to claim 1, wherein the first insulating film has a thickness ranging from 6000 to 8000 Å.

3. The method according to claim 1, wherein the step of planarizing the first insulating film is performed by a chemical mechanical polishing and the remaining portion of the first insulating film has a thickness ranging from 1000 to 2000 Å.

4. The method according to claim 1, wherein the plasma etching is performed in equipment under the condition of an ion density of $1\times10^{10}$ ion/cm$^3$, a pressure ranging from 1000 to 1500 mTorr, a power ranging from 500 to 800 watt, CHF$_3$ having a flow rate ranging from 50 to 70 sccm, CH$_4$ having a flow rate ranging from 100 to 150 sccm and Ar having a flow rate ranging from 1000 to 1500 sccm.

5. The method according to claim 1, wherein the etch barrier layer obtained by the step of forming an etch barrier layer is a SiC film formed by a plasma enhanced chemical vapor deposition.

6. The method according to claim 5, wherein the SiC film has a thickness ranging from 500 to 1000 Å.

7. The method according to claim 1, wherein the step of forming an oxide film is performed by a plasma enhanced chemical vapor deposition and the obtained oxide film has a thickness ranging from 500 to 1000 Å.

8. The method according to claim 1, wherein the etching process of the oxide film is performed in equipment under the condition of an ion density of $1\times10^{10}$ ion/cm$^3$, a pressure ranging from 30 to 50 mTorr, power ranging from 1300 to 1700 watt, CF$_4$ having a flow rate ranging from 80 to 120 sccm, Ar having a flow rate ranging from 200 to 300 sccm and O$_2$ having a flow rate ranging from 15 to 25 sccm.

9. The method according to claim 1, wherein the etching process of the second insulating film is performed under the condition that etch selectivity of the second insulating film to the etch barrier layer is more than 5 so that the etch barrier layer functions as an etch stop.

10. The method according to claim 1, wherein the etching process of the etch barrier layer is performed on the condition of a pressure ranging from 40 to 60 mTorr, power ranging from 200 to 300 watt, C$_4$F$_8$ having a flow rate ranging from 10 to 20 sccm, O$_2$ having a flow rate ranging from 15 to 25 sccm and Ar having a flow rate ranging from 100 to 150 sccm.

11. The method according to claim 1, wherein the adhesive film/diffusion barrier film is a Ti/TiN film formed by a plasma enhanced chemical vapor deposition process.

* * * * *